United States Patent
Ishizuka

(10) Patent No.: US 10,734,970 B2
(45) Date of Patent: Aug. 4, 2020

(54) PHASE SHIFTER MODULE, MULTIPLEXER/DEMULTIPLEXER, AND COMMUNICATION APPARATUS

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 48 days.

(21) Appl. No.: 16/179,004

(22) Filed: Nov. 2, 2018

(65) Prior Publication Data
US 2019/0068166 A1 Feb. 28, 2019

Related U.S. Application Data

(63) Continuation of application No. PCT/JP2017/024820, filed on Jul. 6, 2017.

(30) Foreign Application Priority Data

Jul. 20, 2016 (JP) .................................. 2016-142382

(51) Int. Cl.
*H03H 9/72* (2006.01)
*H03H 7/21* (2006.01)
(Continued)

(52) U.S. Cl.
CPC ................ *H03H 9/72* (2013.01); *H03H 7/21* (2013.01); *H03H 9/6416* (2013.01);
(Continued)

(58) Field of Classification Search
CPC ...... H03H 9/72; H03H 9/6416; H03H 9/6489; H03H 9/725; H03H 7/21; H04B 1/40; H04B 1/405
See application file for complete search history.

(56) References Cited

U.S. PATENT DOCUMENTS

2003/0060170 A1* 3/2003 Tikka ..................... H03H 9/009
455/73
2012/0274431 A1 11/2012 Kato et al.
(Continued)

FOREIGN PATENT DOCUMENTS

GB 2 333 669 A 7/1999
JP 56-156012 A 12/1981
(Continued)

OTHER PUBLICATIONS

Machine translation of JP2002359120 (Year: 2002).*
Official Communication issued in International Patent Application No. PCT/JP2017/024820, dated Sep. 26, 2017.

*Primary Examiner* — Samuel S Outten
(74) *Attorney, Agent, or Firm* — Keating & Bennett, LLP

(57) ABSTRACT

A phase shifter module includes a base material, a common terminal, and individual terminals, the common terminal and the individual terminals being provided at the base material. Inside the base material, phase shifters that are connected between the individual terminals and the common terminal, respectively, are provided. The phase shifters each include a primary coil and a secondary coil that is coupled to the primary coil by magnetic field coupling and define a transformer phase shifter. With this configuration, a phase shifter module for use with SAW filters while reducing or preventing interference among the SAW filters, a multiplexer/demultiplexer that includes the phase shifter module, and a communication apparatus that includes the phase shifter module, are obtained.

20 Claims, 14 Drawing Sheets

(51) Int. Cl.
  *H04B 1/40* (2015.01)
  *H03H 9/64* (2006.01)
  *H04B 1/405* (2015.01)
  *H03H 7/01* (2006.01)
  *H03H 7/09* (2006.01)
  *H03H 1/00* (2006.01)

(52) U.S. Cl.
  CPC .......... *H03H 9/6489* (2013.01); *H03H 9/725* (2013.01); *H04B 1/40* (2013.01); *H04B 1/405* (2013.01); *H03H 7/09* (2013.01); *H03H 7/1758* (2013.01); *H03H 7/1775* (2013.01); *H03H 2001/0085* (2013.01)

(56) References Cited

U.S. PATENT DOCUMENTS

2015/0178434 A1 6/2015 Ishizuka et al.
2015/0371762 A1 12/2015 Ishizuka

FOREIGN PATENT DOCUMENTS

| | | |
|---|---|---|
| JP | 10-270976 A | 10/1998 |
| JP | 11-154804 A | 6/1999 |
| JP | 2002-208875 A | 7/2002 |
| JP | 2002-261651 A | 9/2002 |
| JP | 3337073 B2 | 10/2002 |
| JP | 2002-359120 A | 12/2002 |
| JP | 3475933 B2 | 12/2003 |
| JP | 2004-023655 A | 1/2004 |
| JP | 2004-343735 A | 12/2004 |
| JP | 2012-084833 A | 4/2012 |
| JP | 5672416 B2 | 2/2015 |
| WO | 2014/155873 A1 | 10/2014 |
| WO | 2015/045451 A1 | 4/2015 |

* cited by examiner freq.(600MHz to 3.0GHz)

freq.(600MHz to 3.0GHz)

PHASE SHIFTER MODULE, MULTIPLEXER/DEMULTIPLEXER, AND COMMUNICATION APPARATUS

CROSS REFERENCE TO RELATED APPLICATIONS

This application claims the benefit of priority to Japanese Patent Application No. 2016-142382 filed on Jul. 20, 2016 and is a Continuation Application of PCT Application No. PCT/JP2017/024820 filed on Jul. 6, 2017. The entire contents of each application are hereby incorporated herein by reference.

BACKGROUND OF THE INVENTION

1. Field of the Invention

The present invention relates to a phase shifter provided in a high frequency circuit, and more particularly, to a phase shifter module that includes a plurality of phase shifters, a multiplexer/demultiplexer that includes the phase shifter module, and a communication apparatus that includes the phase shifter module.

2. Description of the Related Art

In general, due to characteristics of SAW filters, the impedance of a SAW filter outside a pass band thereof is substantially short-circuited or in a similar state. Therefore, when a plurality of SAW filters are connected in parallel, a SAW filter looks short-circuited or nearly short-circuited when viewed from another SAW filter. Therefore, these SAW filters interfere with each other. To solve this problem, by adding an LPF or an HPF including an LC circuit, matching of a plurality of SAW filters can be achieved (see, for example, Japanese Patent No. 3475933 and Japanese Patent No. 3337073).

FIG. 15A is a diagram illustrating frequency characteristics of the impedance of a SAW filter plotted on a Smith chart, and FIG. 15B is a diagram illustrating frequency characteristics of the insertion loss and return loss of each SAW filter. Furthermore, FIG. 16 is a circuit diagram in which three SAW filters are connected in parallel, and FIG. 17 is a diagram illustrating frequency characteristics of the insertion loss of the circuit illustrated in FIG. 16.

In FIG. 17, broken lines represent characteristics of the three SAW filters that are each in a single unit state, and solid lines represent characteristics of the three SAW filters that are connected in parallel. As illustrated in the diagram, in a case where pass bands of SAW filters are adjacent to each other, bandpass characteristics deteriorate in end portions of the two adjacent pass bands. Furthermore, in a case where three or more SAW filters are connected in parallel, it is theoretically very difficult to achieve matching.

FIG. 18 is a diagram illustrating the impedance of a SAW filter single unit and an impedance obtained by phase-shifting by adding an HPF, plotted on a Smith chart. In FIG. 18, a trajectory TR0 represents an impedance trajectory of a SAW filter, and a trajectory TR1 represents an impedance trajectory obtained when the SAW filter is viewed through a phase shifter. In the case where phase-shifting is performed with an HPF including an LC circuit, if an attenuation region of a SAW filter exists in the fourth quadrant where a small amount of phase shift is required, matching can be easily achieved. However, if the attenuation region exists in the third quadrant where a large amount of phase shift such as 90 degrees or more is required, it is very difficult to achieve matching, and insertion loss thus deteriorates. Furthermore, as the amount of phase shift increases, the frequency dependence of impedance increases, as indicated by a broken-line oval shape in FIG. 18. For example, there is a big difference in the amount of phase shift between 1,700 MHz (middle band) and 2,700 MHz (high band). Therefore, it is difficult to cause all the frequency regions to look open, and matching cannot be achieved.

SUMMARY OF THE INVENTION

Preferred embodiments of the present invention provide phase shifter modules each for use together with a plurality of SAW filters while reducing or preventing interference among the plurality of SAW filters, multiplexers/demultiplexers including the phase shifter modules, and communication apparatuses including the phase shifter modules.

A phase shifter module according to a preferred embodiment of the present invention includes a base; a common terminal and a plurality of individual terminals provided at the base; and a plurality of phase shifters that are provided inside the base and connected between the plurality of individual terminals and the common terminal. The plurality of phase shifters each include a primary coil and a secondary coil that is coupled to the primary coil by magnetic field coupling. The primary coil and the secondary coil are provided inside the base. The primary coil and the secondary coil each include a plurality of loop-shaped conductive patterns defining a coil of a plurality of turns over a plurality of layers of the base. The primary coil and the secondary coil included in each of the plurality of phase shifters each include a winding axis extending in a lamination direction in which the plurality of layers are laminated. The plurality of phase shifters include a first phase shifter and a second phase shifter that are adjacent to each other. The first phase shifter and the second phase shifter include coupling portions that overlap when viewed in plan in the lamination direction and are coupled at a polarity to reduce or prevent unwanted coupling between the first phase shifter and the second phase shifter. The coupling portions are part of the plurality of loop-shaped conductive patterns.

With the above configuration, in a pass band of a SAW filter, another SAW filter viewed from the SAW filter may be moved to an open phase (phase reversal), a plurality of SAW filters may be connected at high impedance, and a state in which mutual interference is able to be reduced or prevented is able to be achieved. Thus, a plurality of SAW filters are able to be connected easily. Furthermore, phase-shifting is performed using a transformer. Therefore, compared to a phase shifter including an LC filter circuit, the frequency dependence of the amount of phase shift is low. Thus, the phase is able to be inverted over a wide band, and more SAW filters are able to be connected.

Preferably, the primary coil and the secondary coil each include loop-shaped conductive patterns defining a coil of a plurality of turns over a plurality of layers, a connection portion of a second end of the primary coil and a first end of the secondary coil is connected to a reference potential terminal, a first end of the primary coil is connected to the common terminal, and a second end of the secondary coil is connected to a corresponding individual terminal. Preferably, a loop-shaped conductive pattern that is close to the second end of the primary coil among the plurality of loop-shaped conductive patterns of the primary coil and a loop-shaped conductive pattern that is close to the first end of the secondary coil among the plurality of loop-shaped conductive patterns of the secondary coil are closer to each other than a relationship of other loop-shaped conductors.

With the above configuration, loop-shaped conductive patterns each including a primary coil and a secondary coil with high current density and high magnetic field intensity are close to each other. Thus, a coefficient for coupling between the primary coil and the secondary coil is able to be increased, a series parasitic component of a transformer is able to be suppressed, and the frequency dependence of the amount of phase shift is able to be decreased.

Preferably, the primary coil and the secondary coil included in each of the plurality of phase shifters each include a winding axis in a direction in which the plurality of layers are laminated, and winding axes of the plurality of loop-shaped conductive patterns of the primary coil and the secondary coil of each of the phase shifters are arranged in different positions. Accordingly, a coefficient for coupling between the primary coil and the secondary coil efficiently increases, a series parasitic component of the transformer is reduced, and the frequency dependence of the amount of phase shift decreases. Furthermore, unwanted coupling between a primary coil or a secondary coil of each phase shifter and a primary coil or a secondary coil of another phase shifter is less likely to occur, and the independence of a phase shifter is able to be increased.

Preferably, the plurality of phase shifters include a first phase shifter and a second phase shifter that are adjacent to each other, and the first phase shifter and the second phase shifter include coupling portions that overlap when viewed in plan in the winding axis direction and are coupled at a polarity to reduce or prevent unwanted coupling between the first phase shifter and the second phase shifter, the coupling portions being part of the loop-shaped conductive patterns. Accordingly, unwanted coupling between phase shifters that are adjacent to each other is able to be reduced or prevented, a phase shifter is able to be provided and formed within a limited area. Thus, a compact phase shifter module is provided.

Preferably, a number of the plurality of phase shifters is three.

Preferably, a number of the plurality of turns is less than three.

Preferably, a multiplexer/demultiplexer according to a preferred embodiment of the present invention including a common port and a plurality of individual ports, includes the phase shifter module according to any one of the above-described preferred embodiments of the present invention; a circuit substrate on which the phase shifter module is mounted; and a plurality of SAW filters mounted on the circuit substrate. Preferably, the plurality of SAW filters each include a first terminal and a second terminal. Preferably, in each of the plurality of SAW filters, the first terminal is connected to a corresponding one of the plurality of individual terminals of a corresponding phase shifter module. Preferably, the second terminal is connected to an individual input/output terminal. Preferably, the common terminal is the common port, and the individual input/output terminal is a corresponding one of the plurality of individual ports.

With the above configuration, the number of components mounted on a circuit substrate is able to be reduced.

Preferably, a multiplexer/demultiplexer according to a preferred embodiment of the present invention including a common port and a plurality of individual ports, includes the phase shifter module according to any one of the above-described preferred embodiments of the present invention; and a plurality of SAW filters mounted on the phase shifter module. Preferably, the plurality of SAW filters each include a first terminal and a second terminal. Preferably, the common terminal and an individual terminal are provided on a first surface of the base material of the phase shifter module. Preferably, the individual terminal and a SAW filter second connection terminal are provided on a second surface, which is a surface opposite the first surface of the base material. Preferably, the base material of the phase shifter module includes a line that connects the SAW filter second connection terminal to the individual terminal. Preferably, in each of the plurality of SAW filters, the first terminal is connected to a corresponding one of the plurality of individual terminals, and the second terminal is connected to the SAW filter second connection terminal. Preferably, the common terminal is the common port, and the individual terminal is a corresponding one of the plurality of individual ports.

With the above configuration, a multiplexer/demultiplexer as a single component is able to be obtained, and an occupied area on the circuit substrate is able to be significantly reduced.

A communication apparatus according to a preferred embodiment of the present invention includes a power supply circuit; and an antenna. The multiplexer/demultiplexer according to one of the preferred embodiments of the present invention described above is connected between the power supply circuit and the antenna. With this configuration, a communication apparatus in which multiplexing/demultiplexing of signals in a plurality of frequency bands is able to be achieved while the isolation between ports being ensured and impedance matching between the antenna element and the power supply circuit is able to be achieved for each frequency band, is obtained.

According to preferred embodiments of the present invention, phase shifter modules each for use together with a plurality of SAW filters while reducing or preventing interference among the plurality of SAW filters, multiplexers/demultiplexers including the phase shifter modules, and communication apparatuses including the phase shifter modules, are obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
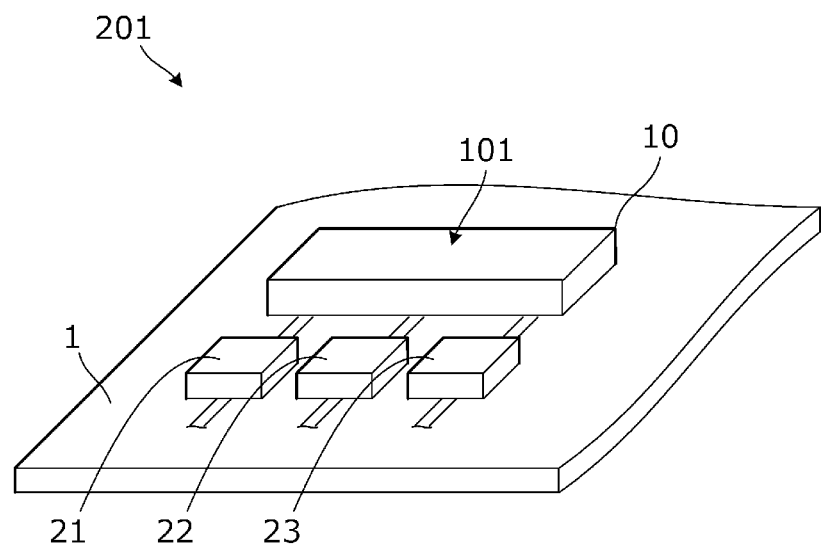
FIG. 1 is a perspective view of a phase shifter module according to a first preferred embodiment of the present invention and a multiplexer/demultiplexer that includes the phase shifter module.

Hereinafter, a plurality of preferred embodiments of the present invention will be described by way of specific examples and with reference to drawings. In the drawings, same elements or portions are referred to with the same signs. Taking into consideration describing main points and facilitating understanding, for convenience, separate preferred embodiments will be described. However, configurations described in different preferred embodiments may be partially replaced or combined. In second and later preferred embodiments, description of matters common to those in the first preferred embodiment will be omitted, and only differences will be described. In particular, similar operations and effects obtained by similar configurations will not be referred to in each of the preferred embodiments.

First Preferred Embodiment

FIG. 1 is a perspective view of a phase shifter module according to a first preferred embodiment and a multiplexer/demultiplexer that includes the phase shifter module. A multiplexer/demultiplexer 201 according to this preferred embodiment includes a circuit substrate 1, SAW filters 21, 22, and 23, and a phase shifter module 101, and the SAW filters 21, 22, and 23 and the phase shifter module 101 are mounted on the circuit substrate 1. The phase shifter module 101 preferably includes three phase shifters, for example. The three phase shifters are provided at a base material 10.

Figure 2:
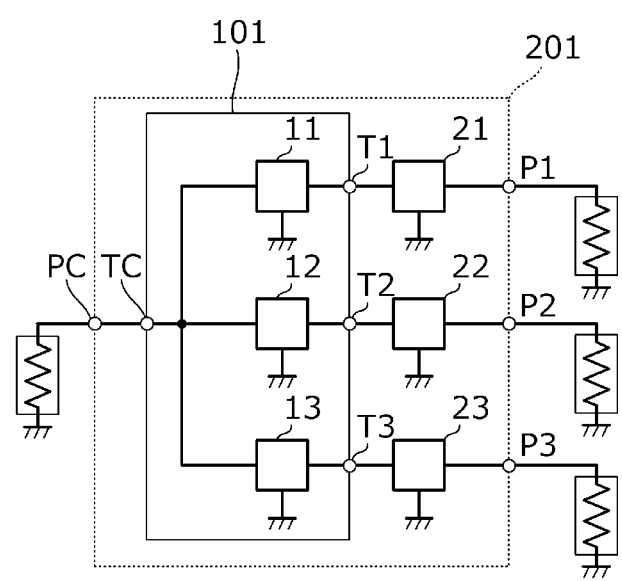
FIG. 2 is a circuit diagram of a multiplexer/demultiplexer 201.

FIG. 2 is a circuit diagram of a multiplexer/demultiplexer 201. The multiplexer/demultiplexer 201 includes a common port PC and individual ports P1, P2, and P3. Three phase shifters 11, 12, and 13 are connected between a common terminal TC and individual terminals T1, T2, and T3, respectively. The common terminal TC of the phase shifter module 101 is directly connected to the common port PC. The SAW filters 21, 22, and 23 are connected between the individual terminals T1, T2, and T3 and the individual ports P1, P2, and P3, respectively.

For example, an antenna is connected to the common port PC of the multiplexer/demultiplexer 201. Furthermore, communication circuits are connected to the individual ports P1, P2, and P3. In FIG. 2, the antenna and the communication circuits are each represented by a terminator symbol. The center frequencies of the pass bands of the SAW filters 21, 22, and 23 are, for example, about 700 MHz, about 800 MHz, and about 900 MHz, respectively.

Figure 3:
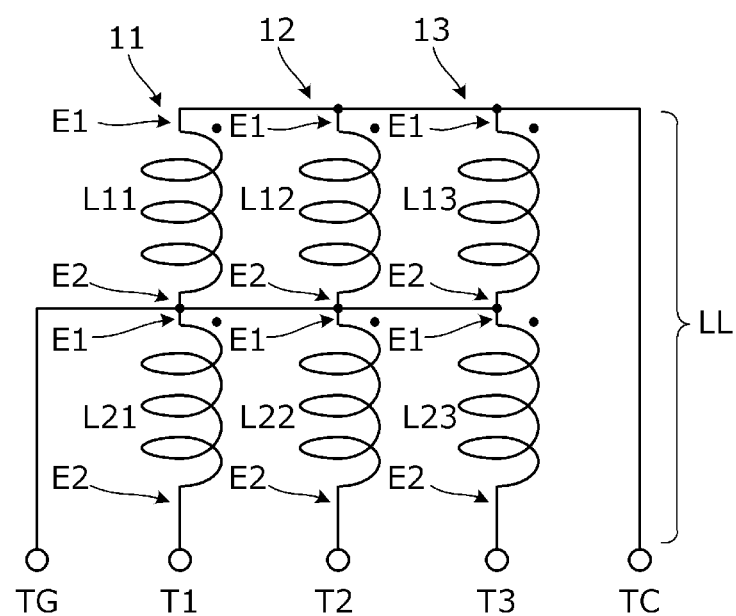
FIG. 3 is a circuit diagram of a phase shifter module 101.

FIG. 3 is a circuit diagram of the phase shifter module 101. In FIG. 3, primary coils and secondary coils are each represented by a circuit symbol. A primary coil L11 and a secondary coil L21 are magnetically coupled to each other and define the phase shifter 11 including a transformer structure. In a similar manner, a primary coil L12 and a secondary coil L22 are magnetically coupled to each other and define the phase shifter 12 including a transformer structure, and a primary coil L13 and a secondary coil L23 are magnetically coupled to each other and define the phase shifter 13 having a transformer structure. As described later, there is substantially no unwanted coupling between one of the phase shifters 11, 12, and 13 and another one of the phase shifters 11, 12, and 13.

A connection portion of a second end E2 of the primary coil L11 and a first end E1 of the secondary coil L21 is connected to a reference potential terminal TG, a first terminal E1 of the primary coil L11 is connected to the common terminal TC, and a second terminal E2 of the secondary coil L21 is connected to the individual terminal T1. In a similar manner, a connection portion of a second end of the primary coil L12 and a first end of the secondary coil L22 is connected to the reference potential terminal TG, a first end of the primary coil L12 is connected to the common terminal TC, and a second end of the secondary coil L22 is connected to the individual terminal T2. Furthermore, a connection portion of a second end of the primary coil L13 and a first end of the secondary coil L23 is connected to the reference potential terminal TG, a first end of the primary coil L13 is connected to the common terminal TC, and a second end of the secondary coil L23 is connected to the individual terminal T3.

The primary coil L11 and the secondary coil L21 of the phase shifter 11 are cumulatively connected. In a similar manner, the primary coil L12 and the secondary coil L22 of the phase shifter 12 are cumulatively connected, and the primary coil L13 of the secondary coil L23 of the phase shifter 13 are cumulatively connected.

In FIG. 3, path lengths (line lengths) from the individual terminals T1, T2, and T3 to the secondary coils L21, L22, and L23 affect the amount of phase shift. However, a path length (line length) LL from a common connection point of the primary coils L11, L12, and L13 to the common terminal TC does not affect the amounts of phase shift of the phase shifters 11, 12, and 13. Therefore, the primary coils L11, L12, and L13 may be provided in an upper portion of the base material, and the distance from the portion where the primary coils L11, L12, and L13 are arranged to the common terminal TC on a lower surface of the base material may be long. Thus, the path lengths from the individual terminals T1, T2, and T3 to the secondary coils L21, L22, and L23 are able to be shortened, so that the amounts of phase shift by the phase shifters 11, 12, and 13 are able to be determined accurately.

Figure 4:
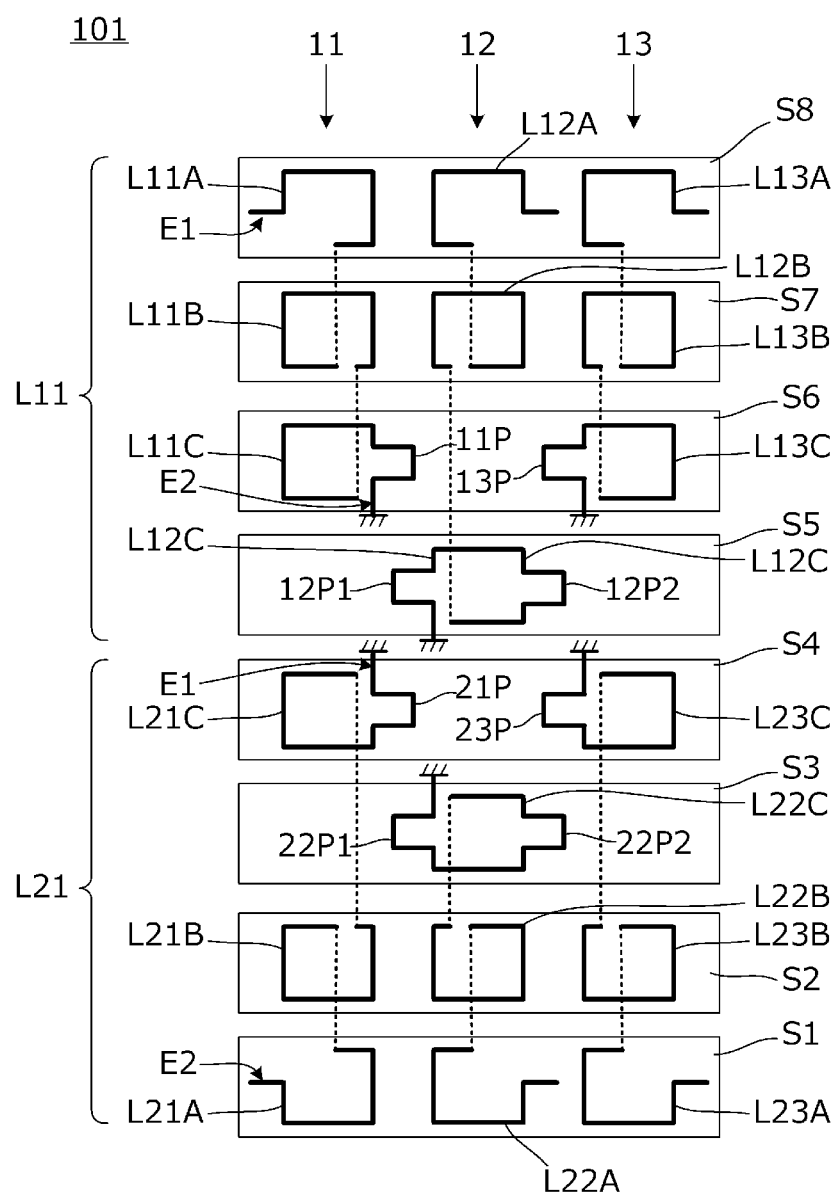
FIG. 4 is an exploded plan view illustrating conductive patterns of primary coils and secondary coils defining individual phase shifters of the phase shifter module 101.

FIG. 4 is an exploded plan view illustrating conductive patterns of primary coils and secondary coils defining phase shifters of the phase shifter module 101.

The base material 10 of the phase shifter module 101 is a multilayer body including a plurality of base material layers including base material layers S1 to S8. For example, loop-shaped conductive patterns L11A, L12A, and L13A are provided in the base material layer S8.

Loop-shaped conductive patterns L11A, L11B, and L11C define the primary coil of the phase shifter 11. Loop-shaped conductive patterns L21A, L21B, and L21C define the secondary coil of the phase shifter 11. Furthermore, loop-shaped conductive patterns L12A, L12B, and L12C define the primary coil of the phase shifter 12, and loop-shaped conductive patterns L22A, L22B, and L22C define the secondary coil of the phase shifter 12. Furthermore, loop-shaped conductive patterns L13A, L13B, and L13C define the primary coil of the phase shifter 13, and loop-shaped conductive patterns L23A, L23B, and L23C define the secondary coil of the phase shifter 13.

In FIG. 4, end portions connected to the reference potential terminal (the terminal TG in FIG. 3) are each represented by a ground symbol. Furthermore, inter-layer connection conductors are represented by broken lines.

The loop-shaped conductive patterns L11A, L11B, and L11C define a coil of slightly less than three turns over three layers, for example. In a similar manner, the loop-shaped conductive patterns L21A, L21B, and L21C define a coil of slightly less than three turns over three layers. Furthermore, the loop-shaped conductive patterns L12A, L12B, and L12C define a coil of slightly less than three turns over three layers, and the loop-shaped conductive patterns L22A, L22B, and L22C define a coil of slightly less than three turns over three layers, for example. Furthermore, the loop-shaped conductive patterns L13A, L13B, and L13C define a coil of slightly less than three turns over three layers, and the loop-shaped conductive patterns L23A, L23B, and L23C define a coil of slightly less than three turns over three layers, for example.

As illustrated in FIG. 4, the primary coils and the secondary coils of the phase shifters 11, 12, and 13 each have a winding axis in a direction in which the conductive patterns are laminated, and the winding axes of the plurality of loop-shaped conductive patterns of the primary coils and the secondary coils of the phase shifters are arranged in different positions.

Furthermore, as illustrated in FIG. 4, the loop-shaped conductive pattern L11C that is close to the second end E2 of the primary coil L11 among the plurality of loop-shaped conductive patterns of the primary coil L11 of the phase shifter 11 and the loop-shaped conductive pattern L21C that is close to the first end E1 of the secondary coil L21 among the plurality of loop-shaped conductive patterns of the secondary coil L21 are closer to each other than relationship of the other loop-shaped conductors (L11B, L11A, L21B, and L21A). This structure is applied to the phase shifters 12 and 13.

The loop-shaped conductive patterns L11C and L12C, which are part of the primary coils of the phase shifters 11 and 12, include coupling portions 11P and 12P1, respectively, that overlap when viewed in plan in the winding axis direction and are coupled at a polarity to reduce or prevent unwanted coupling between phase shifters that are adjacent to each other (unwanted coupling between the phase shifters 11 and 12). Furthermore, the loop-shaped conductive patterns L21C and L22C, which are part of the secondary coils, include coupling portions 21P and 22P1, respectively, that overlap when viewed in plan in the winding axis direction and are coupled at a polarity to reduce or prevent unwanted coupling between phase shifters that are adjacent to each other.

The loop-shaped conductive patterns L12C and L13C, which are part of the primary coils of the phase shifters 12 and 13, include coupling portions 12P2 and 13P, respectively, that overlap when viewed in plan in the winding axis direction and are coupled at a polarity to reduce or prevent unwanted coupling between phase shifters that are adjacent to each other (unwanted coupling between the phase shifters 12 and 13). Furthermore, the loop-shaped conductive patterns L22C and L23C, which are part of the secondary coils, include coupling portions 22P2 and 23P, respectively, that overlap when viewed in plan in the winding axis direction and are coupled at a polarity to reduce or prevent unwanted coupling between phase shifters that are adjacent to each other.

Figure 5A:
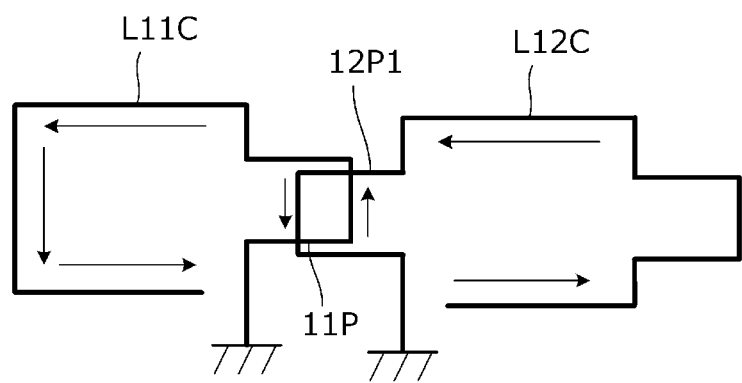
FIGS. 5A and 5B are diagrams for explaining operation of coupling portions.
Figure 5B:
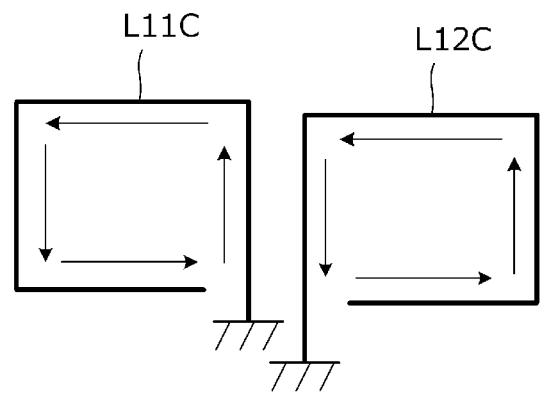

FIGS. 5A and 5B are diagrams for explaining operation of the coupling portions mentioned above.

FIG. 5A is a diagram illustrating a coupling relationship of the loop-shaped conductive pattern L11C, which is a part of the phase shifter 11, and the loop-shaped conductive pattern L12C, which is a part of the phase shifter 12. The coupling portion 11P of the loop-shaped conductive pattern L11C and the coupling portion 12P1 of the loop-shaped conductive pattern L12C overlap.

FIG. 5B is a diagram illustrating a state in which two loop-shaped conductors that are adjacent to each other are coupled, in a comparative example. The loop-shaped conductive pattern L11C and the loop-shaped conductive pattern L12C are adjacent to each other. Therefore, when current in a direction represented by arrows flows in the loop-shaped conductive pattern L11C, current in a direction represented by arrows is induced to flow in the loop-shaped conductive pattern L12C.

In contrast, in this preferred embodiment illustrated in FIG. 5A, portions other than the coupling portion 11P of the loop-shaped conductive pattern L11C and portions other than the coupling portion 12P1 of the loop-shaped conductive pattern L12C are coupled (first coupling) as in the comparative example illustrated in FIG. 5B. In addition, coupling (second coupling) is achieved between the coupling portions 11P and 12P1. The polarity of the second coupling is opposite the polarity of the first coupling, and therefore, coupling between the coupling portions 11P and 12P1 operates in a direction in which coupling between the loop-shaped conductive pattern L11C and the loop-shaped conductive pattern L12C is canceled out. Thus, in spite of the loop-shaped conductive pattern L11C and the loop-shaped conductive pattern L12C being adjacent to each other, substantial coupling is able to be eliminated.

In addition to the coupling portions 11P and 12P1 illustrated in FIG. 4, regarding the relationship of the coupling portion 12P1 and the coupling portion 21P and the relationship of the coupling portion 21P and the coupling portion 22P1, coupling between the coupling portions operates such that coupling between the loop-shaped conductive patterns is canceled out. Furthermore, the same applies to the relationship of the phase shifter 12 and the phase shifter 13. Also, regarding the relationship of the coupling portion 13P and the coupling portion 12P2, the relationship of the coupling portion 12P2 and the coupling portion 23P, and the relationship of the coupling portion 23P and the coupling portion 22P2, coupling between the coupling portions operates such that coupling between the loop-shaped conductive patterns is canceled out.

Figure 6A:
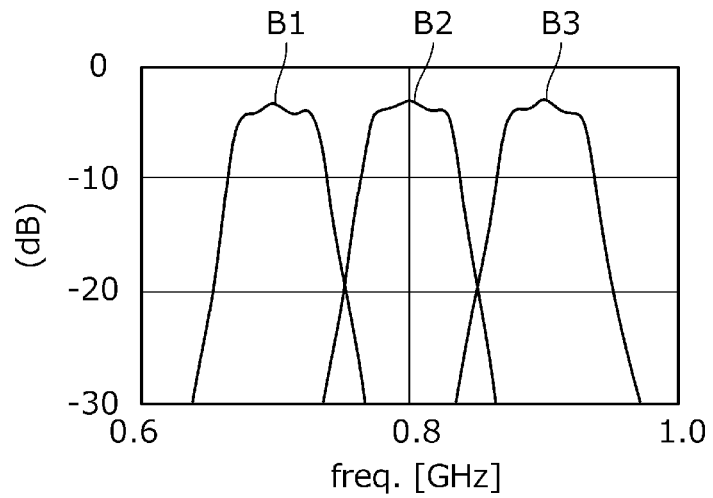
FIG. 6A is a diagram illustrating frequency characteristics of the insertion loss of a region from a common port PC to individual ports P1, P2, and P3 of the multiplexer/demultiplexer in FIG. 2.

FIG. 6A is a diagram illustrating the frequency characteristics of insertion loss of a region from the common port PC to the individual ports P1, P2, and P3 of the multiplexer/demultiplexer in FIG. 2. In FIG. 6A, bandpass characteristics B1, B2, and B3 correspond to the band pass characteristics of the SAW filters 21, 22, and 23, respectively.

Figure 6B:
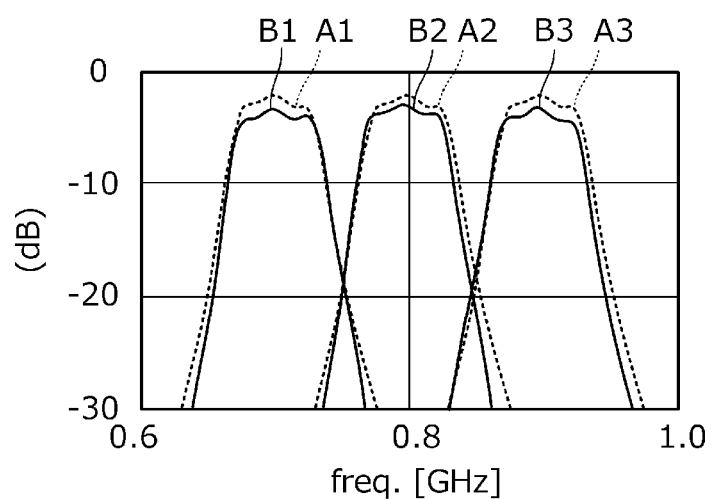
FIG. 6B is a diagram illustrating deterioration of insertion loss for a case where the phase shifter module 101 is provided and a case where the phase shifter module 101 is not provided.

FIG. 6B is a diagram illustrating deterioration of insertion loss for a case where the phase shifter module 101 is provided and a case where the phase shifter module 101 is not provided. In FIG. 6B, bandpass characteristics A1, A2, and A3 represent the band pass characteristics of the SAW filters 21, 22, and 23 as individual units in a state where the phase shifter module 101 is not provided. Accordingly, insertion loss caused by insertion of the phase shifter module 101 is about 1 dB, for example.

Figure 6C:
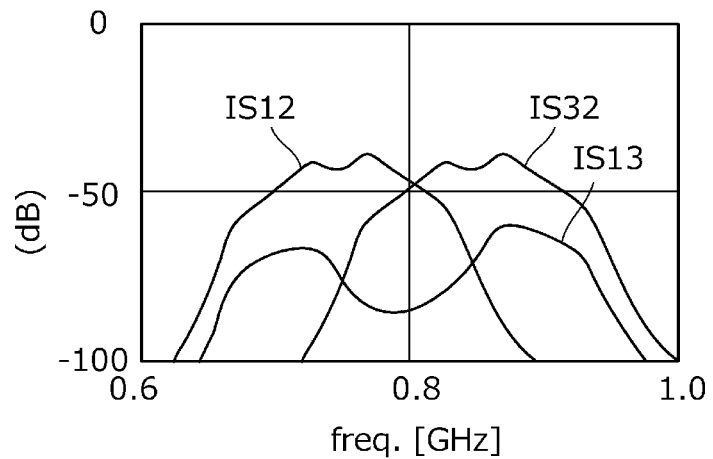
FIG. 6C is a diagram illustrating isolation characteristics between individual ports.

FIG. 6C is a diagram illustrating isolation characteristics between individual ports. In FIG. 6C, an isolation IS12 between ports, an isolation IS32 between ports, and an isolation IS13 between ports represent the isolation characteristics between the individual ports P1 and P2, the isolation characteristics between the individual ports P3 and P2, and the isolation characteristics between the individual ports P1 and P3, respectively. As described above, the phase shifter module 101 is connected between the three SAW filters 21, 22, and 23 and the common port PC, and the SAW filters 21, 22, and 23 are mutually isolated in an equivalent manner by the phase shifter module 101. Therefore, isolation characteristics of about 40 dB or more are able to be ensured between the individual ports P1, P2, and P3, for example.

Figure 7:
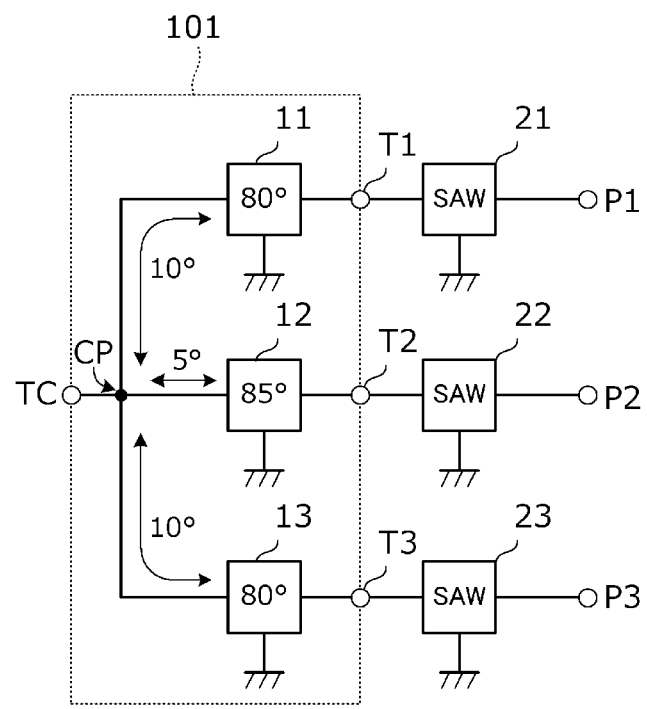
FIG. 7 is a diagram illustrating an example of the amount of phase shift of the phase shifters 11, 12, and 13 of the phase shifter module 101.

FIG. 7 is a diagram illustrating an example of the amount of phase shift of the phase shifters 11, 12, and 13 of the phase shifter module 101. In the phase shifter module 101, the amount of phase shift in a circuit portion from the connection point CP to each of the SAW filters 21, 22, and 23 is determined such that a corresponding SAW filter looks in an open state outside a communication bandwidth (the pass band of the SAW filter) in which the corresponding SAW filter is used. Each of the SAW filters 21, 22, and 23 is substantially short-circuited outside the pass band thereof. Therefore, for example, the SAW filter 21 is designed such that the amount of phase shift between the connection point CP and the individual terminal T1 is 180 degrees by a reciprocating operation outside the pass band thereof. Accordingly, when the SAW filter 21 is viewed from the connection point CP point, the SAW filter 21 looks equivalently open-circuited outside the pass band thereof, and no electric power thus flows.

In the example illustrated in FIG. 7, the total sum of the amount of phase shift of 10 degrees obtained by an inductance component from the connection point CP to the individual terminal T1 and the amount of phase shift of about 80 degrees obtained by the phase shifter 11 is about 90 degrees, for example. Therefore, at a frequency outside the pass band of the SAW filter 21, the SAW filter 21 looks in an open state when viewed from the connection point CP. Furthermore, the total sum of the amount of phase shift of about 5 degrees obtained by an inductance component from the connection point CP to the individual terminal T2 and the amount of phase shift of about 85 degrees obtained by the phase shifter 12 is about 90 degrees, for example. Therefore, at a frequency outside the pass band of the SAW filter 22, the SAW filter 22 looks in an open state when viewed from the connection point CP.

The amounts of phase shift through paths from end portions of the primary coils of the phase shifters 11, 12, and 13 to the connection point CP are clear in advance. Therefore, the numbers of turns of the primary coils and the secondary coils and parasitic components such as parasitic capacitances and parasitic inductances are able to be determined such that the amounts of phase shift of the phase shifters 11, 12, and 13 have specific values.

Ideally, in transformer phase shifters, the amount of phase rotation does not depend on frequency. Therefore, according to this preferred embodiment, in a range from a middle band to a high band (about 1,700 MHz to about 2,700 MHz) of cellular phones, a certain amount of phase shift is able to be achieved. Furthermore, compared to a case where phase-shifting is performed by an LC filter, matching is able to be achieved over a wide band, and insertion loss is able to be decreased.

Second Preferred Embodiment

In a second preferred embodiment of the present invention, an example of a multiplexer/demultiplexer structured as a single component will be described.

Figure 8:
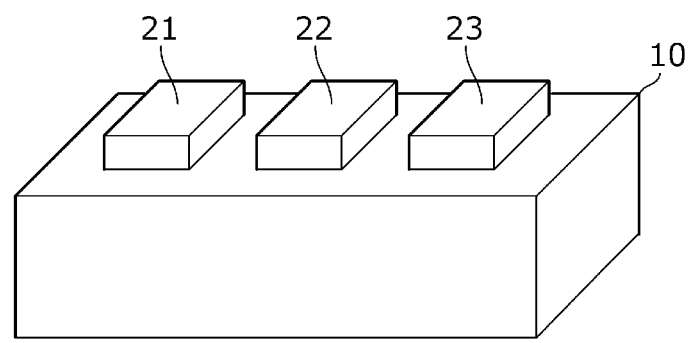
FIG. 8 is a perspective view of a multiplexer/demultiplexer 202.
Figure 9:
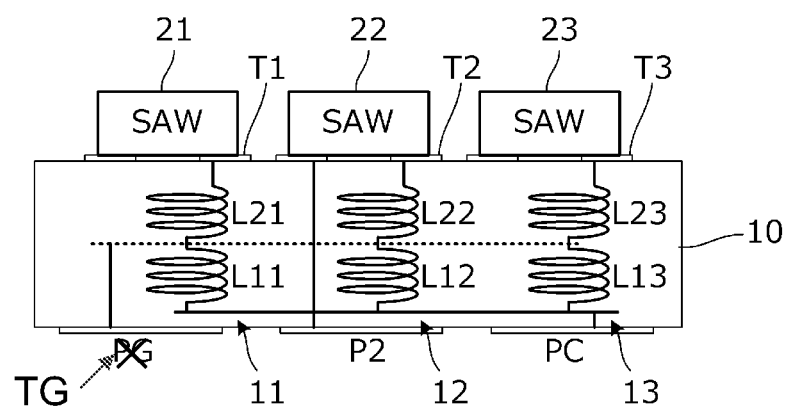
FIG. 9 is a front view of the multiplexer/demultiplexer 202 according to a preferred embodiment of the present invention.
Figure 10:
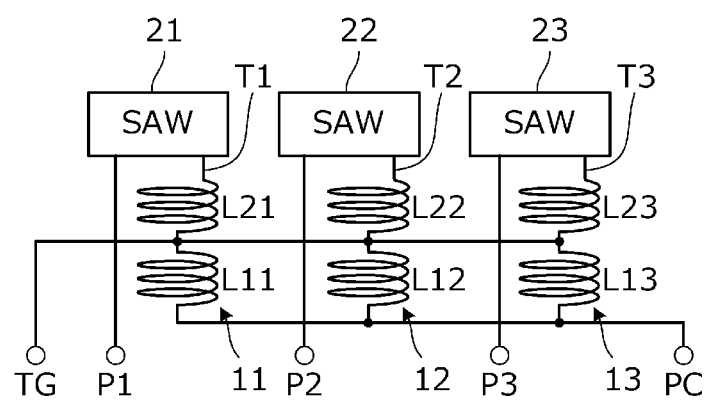
FIG. 10 is a circuit diagram of the multiplexer/demultiplexer 202.

FIG. 8 is a perspective view of a multiplexer/demultiplexer 202. FIG. 9 is a front view of the multiplexer/demultiplexer 202 according to this preferred embodiment. In FIG. 9, the inside of the base material 10 is schematically illustrated. Furthermore, FIG. 10 is a circuit diagram of the multiplexer/demultiplexer 202. FIG. 10 is rendered taking into consideration the positional relationship of the phase shifters 11, 12, and 13 and the SAW filters 21, 22, and 23.

As illustrated in FIGS. 9 and 10, the phase shifters 11, 12, and 13 are provided inside the base material 10. On the upper surface of the base material 10, lands on which the SAW filters 21, 22, and 23 are to be mounted are provided. The individual terminals T1, T2, and T3 are part of the lands, and second terminals of the SAW filters 21, 22, and 23 are connected to the individual terminals T1, T2, and T3, respectively. On the lower surface of the base material 10, the common port PC, the individual ports P1, P2, and P3, and a ground terminal TG are formed. All of the common port PC and the individual ports P1, P2, and P3 are "terminals". However, in association with terms in FIG. 2 referred to in the first preferred embodiment, the common port PC and the individual ports P1, P2, and P3 will be referred to as "ports". The individual ports P1, P2, and P3 are connected to first terminals of the SAW filters 21, 22, and 23 through lines inside the base material 10.

As is clear from comparison between the circuit diagram of the phase shifter module 101 illustrated in FIG. 3 in the first preferred embodiment and the circuit diagram of the multiplexer/demultiplexer 202 illustrated in FIG. 10 in this preferred embodiment, in the multiplexer/demultiplexer 202 according to this preferred embodiment, the primary coils L11, L12, and L13 are arranged in a lower portion of the base material 10, and the secondary coils L21, L22, and L23 are arranged in an upper portion of the base material 10. With this structure, the path lengths from the phase shifters 11, 12, and 13 to the SAW filters 21, 22, and 23 are shortened, and the amount of phase shift by the phase shifters 11, 12, and 13 is able to be determined accurately.

Also in this preferred embodiment, as in the first preferred embodiment, matching over a wide band is able to be achieved, and insertion loss is able to be decreased.

Third Preferred Embodiment

In a third preferred embodiment of the present invention, an example of a communication apparatus that includes a multiplexer/demultiplexer will be described.

Figure 11:
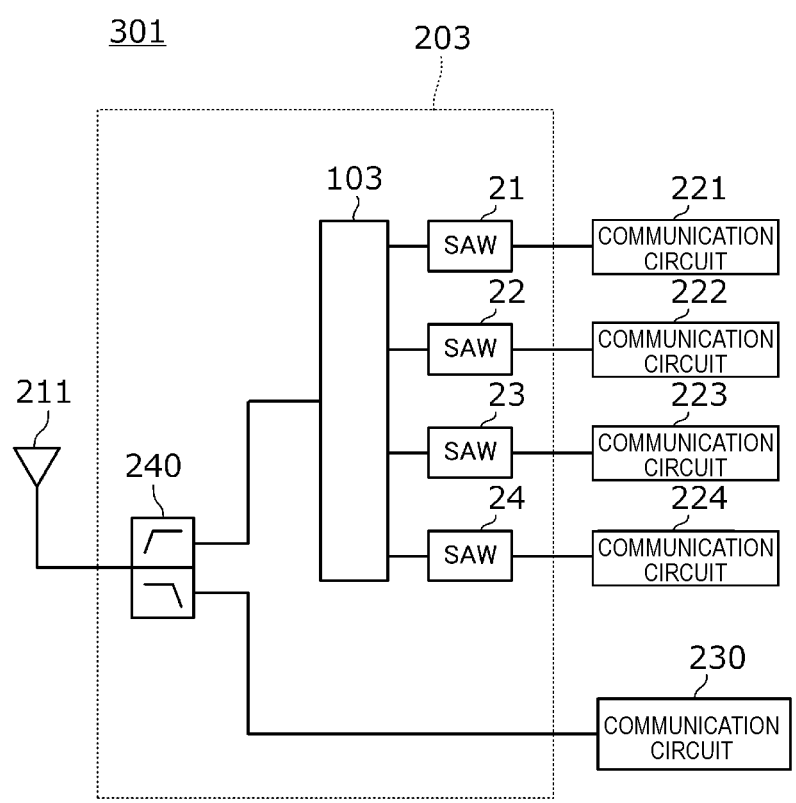
FIG. 11 is a circuit diagram of a communication apparatus 301.

FIG. 11 is a circuit diagram of a communication apparatus 301. The communication apparatus 301 includes an antenna 211, a reception module 203, and communication circuits 221, 222, 223, 224, and 230. The reception module 203 includes a multiplexer/demultiplexer including a phase shifter module 103 and SAW filters 21, 22, 23, and 24. The communication circuits 221, 222, 223, and 224 are communication circuits for bands on a high band side, and the multiplexer/demultiplexer is connected between a high pass filter side of a diplexer 240 and the communication circuits 221, 222, 223, and 224. The communication circuit 230 is a communication circuit on a low band side and is connected to a low pass filter side of the diplexer 240.

Structures of individual phase shifters in the phase shifter module 103 illustrated in FIG. 11 and the connection relationship of the phase shifters are the same as those described in the first and second preferred embodiments. Center frequencies of pass bands of the SAW filters 21, 22, 23, and 24 are, for example, about 600 MHz, about 700 MHz, about 800 MHz, and about 900 MHz.

Fourth Preferred Embodiment

Figure 12:
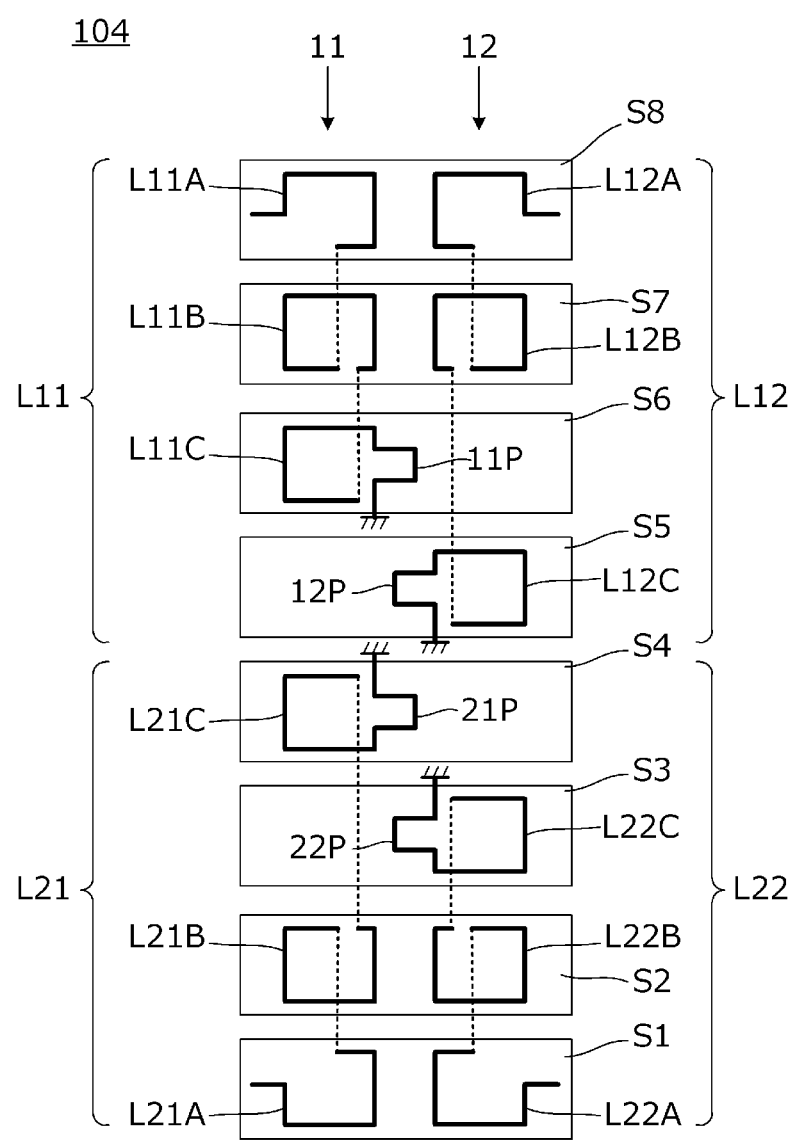
FIG. 12 is an exploded plan view illustrating conductive patterns of primary coils and secondary coils defining individual phase shifters of a phase shifter module 104 according to a fourth preferred embodiment of the present invention.

In a fourth preferred embodiment, a phase shifter module that includes two phase shifters will be described. FIG. 12 is an exploded plan view illustrating conductive patterns of primary coils and secondary coils defining phase shifters of a phase shifter module 104 according to the fourth preferred embodiment.

A base material of the phase shifter module 104 is a multilayer body including a plurality of base material layers including the base material layers S1 to S8. For example, loop-shaped conductive patterns L11A and L12A are provided in the base material layer S8.

The primary coil L11 of the phase shifter 11 includes the loop-shaped conductive patterns L11A, L11B, and L11C, and the secondary coil L21 of the phase shifter 11 includes the loop-shaped conductive patterns L21A, L21B, and L21C. Furthermore, the primary coil L12 of the phase shifter 12 includes the loop-shaped conductive patterns L12A, L12B, and L12C, and the secondary coil L22 of the phase shifter 12 includes the loop-shaped conductive patterns L22A, L22B, and L22C.

The loop-shaped conductive patterns L11C and L12C, which are part of the primary coils L11 and L12, include the coupling portions 11P and 12P, respectively, that overlap when viewed in plan in the winding axis direction and are coupled at a polarity to reduce or prevent unwanted coupling between the phase shifters 11 and 12. Furthermore, the loop-shaped conductive patterns L21C and L22C, which are part of the secondary coils, include the coupling portions 21P and 22P, respectively, that overlap when viewed in plan in the winding axis direction and are coupled at a polarity to reduce or prevent unwanted coupling between phase shifters that are adjacent to each other.

Operation of the coupling portions 11P, 12P, 21P, and 22P is the same as that for the phase shifter module illustrated in FIG. 4 in the first preferred embodiment.

Also with a phase shifter module that includes two phase shifters as described in this preferred embodiment, unwanted coupling between phase shifters that are adjacent to each other is substantially eliminated.

Fifth Preferred Embodiment

In a fifth preferred embodiment, a phase shifter for which a specific amount of phase shift is set will be described.

Figure 13:
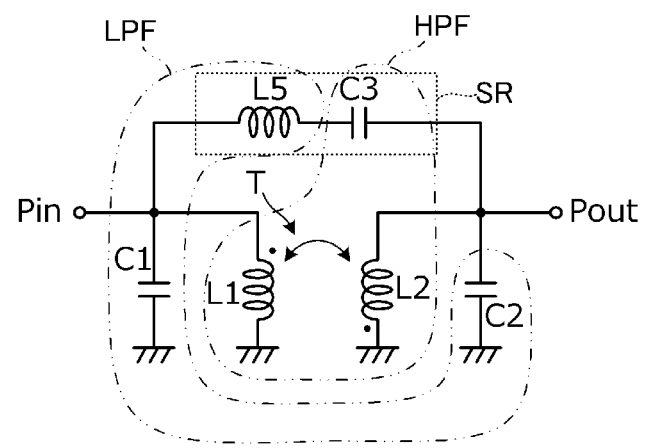
FIG. 13 is a circuit diagram of a phase shifter 11A according to a fifth preferred embodiment of the present invention.

FIG. 13 is a circuit diagram of a phase shifter 11A according to the fifth preferred embodiment. The phase shifter 11A is different from the phase shifter 11 illustrated in FIG. 3 and other figures in the first preferred embodiment in that the phase shifter 11A includes impedance adjusting elements such as capacitance elements C1, C2, and C3 and an inductance element L5. Furthermore, the third capacitance element C3 is connected between a first coil L1 and a second coil L2. Furthermore, a series circuit SR including the third capacitance element C3 and the inductance element L5 is provided between a first port Pin and a second port Pout of a transformer T.

As illustrated in FIG. 13, by providing the LC series circuit SR including the third capacitance element C3 and the inductance element L5 in parallel to the transformer T (as a bypass path), the phase shifter 11A according to this preferred embodiment includes a low pass filter unit LPF and a high pass filter unit HPF. That is, the first capacitance element C1, the second capacitance element C2, and the inductance element L5 define the low pass filter unit LPF, and the first coil L1, the second coil L2, and the third capacitance element C3 define the high pass filter unit HPF. It may also be said that parallel parasitic inductance components of the transformer T as the first coil L1 and the second coil L2 and the third capacitance element C3 define the high pass filter HPF.

Figure 14:
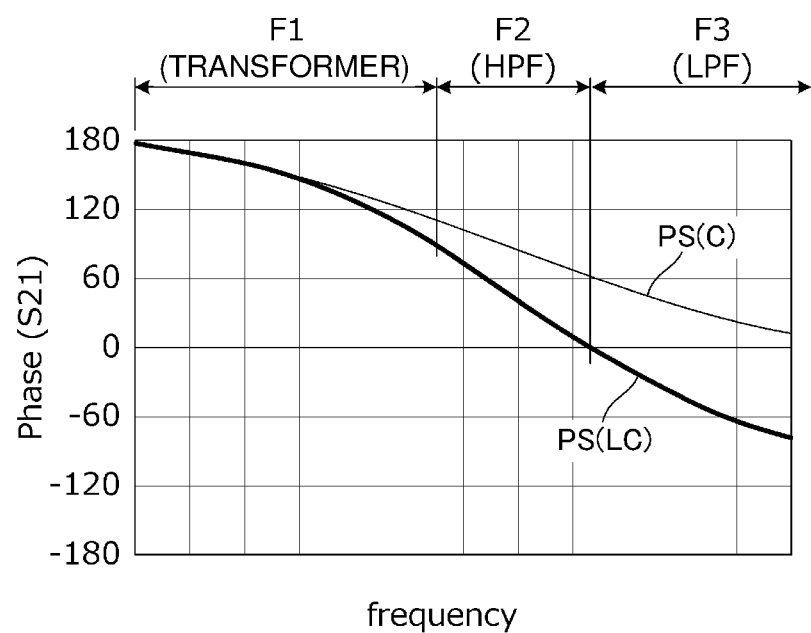
FIG. 14 is a diagram illustrating frequency characteristics of the phase shifter 11A according to the fifth preferred embodiment of the present invention and a phase shifter according to a comparative example.
Figure 15A:
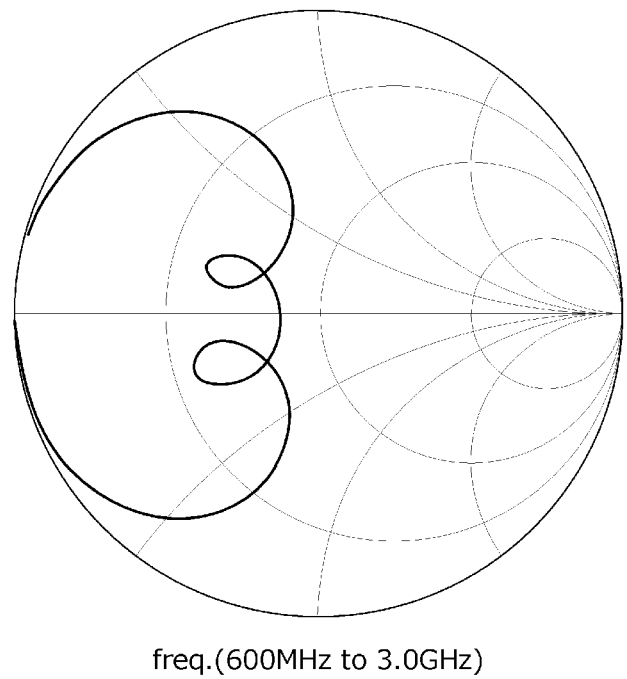
FIG. 15A is a diagram illustrating frequency characteristics of the impedance of a SAW filter plotted on a Smith chart.
Figure 15B:
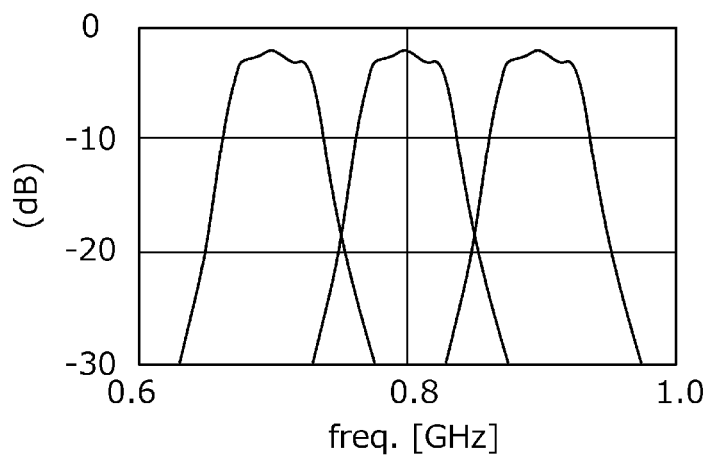
FIG. 15B is a diagram illustrating frequency characteristics of the insertion loss and return loss of each SAW filter.
Figure 16:
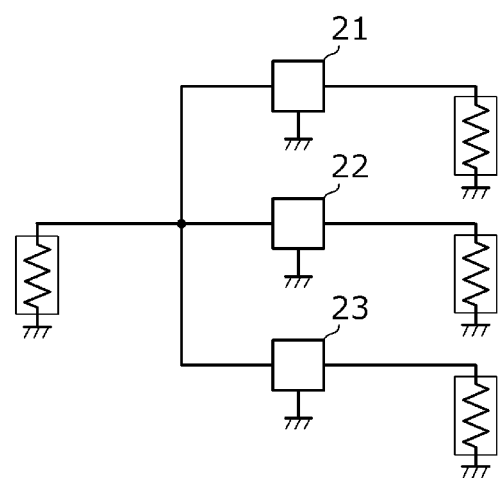
FIG. 16 is a circuit diagram in which three SAW filters are connected in parallel.
Figure 17:
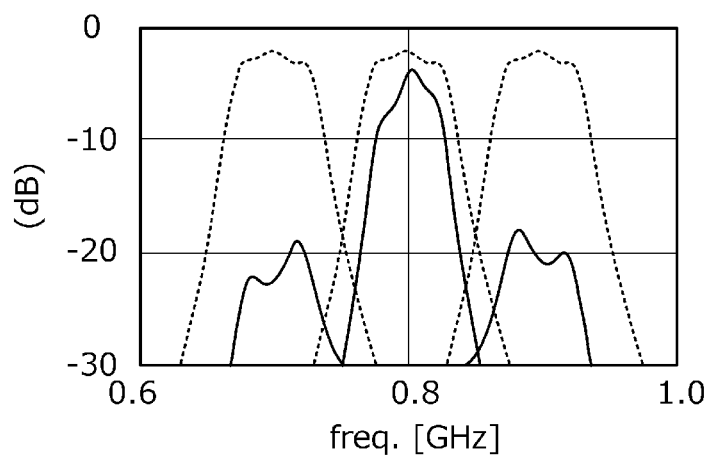
FIG. 17 is a diagram illustrating frequency characteristics of the insertion loss of the circuit illustrated in FIG. 16.
Figure 18:
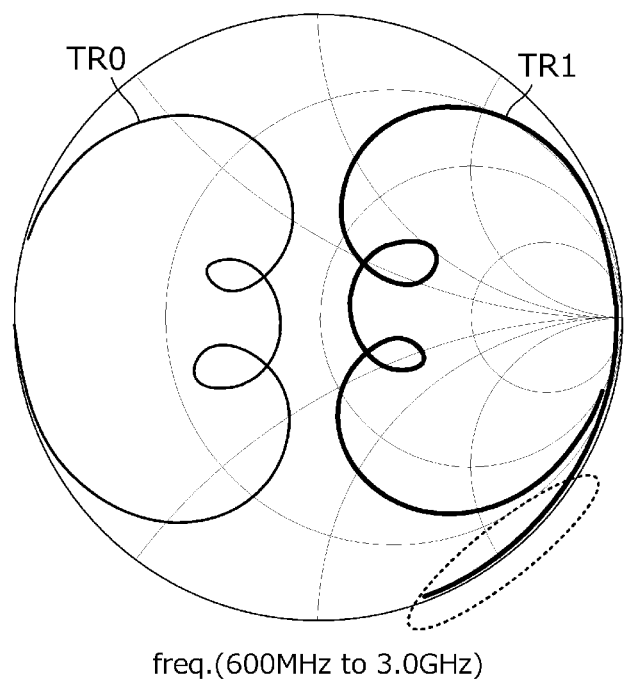
FIG. 18 is a diagram illustrating the impedance of a SAW filter single unit and an impedance obtained by phase-shifting by adding an HPF plotted on a Smith chart.

FIG. 14 is a diagram illustrating frequency characteristics of the phase shifter 11A according to this preferred embodiment and frequency characteristics of a phase shifter according to a comparative example. In the phase shifter according to the comparative example, the inductance element L5 is not provided and the third capacitance element C3 is provided at a bypass path in FIG. 13.

In FIG. 14, a curve PS(LC) represents frequency characteristics of the phase shifter 11A, and a curve PS(C) represents frequency characteristics of the phase shifter according to the comparative example. The phase shifter according to the comparative example operates as a transformer phase shifter in a low frequency band. In a high frequency band, the amount of signal bypassing the third capacitance element C3 increases, and the amount of phase shift gradually approaches 0 degrees.

In contrast, the phase shifter 11A according to this preferred embodiment has a negative amount of phase shift at high frequencies. In FIG. 14, as described later, operation of the phase shifter 11A according to this preferred embodiment is divided into three frequency bands F1, F2, and F3 and represented.

In the low frequency band F1, the capacitance of the third capacitance element C3 is dominant in the LC series circuit SR. Therefore, a signal propagating between the ports P1 and P2 hardly bypasses the LC series circuit SR. That is, characteristics of the transformer T appear.

In the middle frequency band F2, the capacitance of the third capacitance element C3 is more dominant than the inductance element L5 of the LC series circuit SR, and the LC series circuit SR is thus capacitive. Therefore, the bypass circuit operates as a high pass filter, and the amount of phase shift decreases as frequency increases.

In the high frequency band F3, the inductance of the inductance element L5 is more dominant than the third capacitance element C3 of the LC series circuit SR, and the LC series circuit SR is thus inductive. Therefore, the bypass circuit operates as a low pass filter, and the amount of phase shift is negative. A frequency at which the amount of phase shift is 0 degrees corresponds to a series resonant frequency of the LC series circuit SR.

The frequency characteristics of the above-mentioned amount of phase shift are determined according to the first capacitance element C1, the second capacitance element C2, the third capacitance element C3, the inductance element L5, and a parallel parasitic inductance component of the transformer T.

Accordingly, the amount of phase shift is able to have specific large frequency characteristics. Furthermore, over a wide frequency band, a specific amount of phase shift corresponding to the frequency can be obtained.

Furthermore, the first capacitance element C1, the second capacitance element C2, the third capacitance element C3, and the inductance element L5 not only determine the frequency characteristics of the amount of phase shift but also operate as elements to achieve matching to a specific impedance (in general, about 50Ω, for example).

The above-mentioned impedance adjusting elements are provided by conductive patterns inside the base material. Alternatively, the impedance adjusting elements may be mounted on the base material. As described in this preferred embodiment, by adding the impedance adjusting elements, a specific amount of phase shift is able to be determined.

In conclusion, all the description of the foregoing preferred embodiments is exemplification and is not intended to provide limitations. Modifications and changes may be made in an appropriate manner by those skilled in the art. For example, in each of the foregoing preferred embodiments, a U-shaped coupling portion is provided in part of a loop-shaped conductive pattern. However, the coupling portion is not limited to being U-shaped. Coupling adjustment is able to be achieved with various shapes such as a round shape, an oval shape, and a polygon shape. Furthermore, instead of a coupling portion having a special projective shape, loop-shaped conductive patterns arranged such that they partially overlap when viewed in plan to achieve coupling adjustment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A phase shifter module comprising:
   a base;
   a common terminal and a plurality of individual terminals provided at the base; and
   a plurality of phase shifters that are provided inside the base and connected between the plurality of individual terminals and the common terminal; wherein
   the plurality of phase shifters each include a primary coil and a secondary coil that is coupled to the primary coil by magnetic field coupling;
   the primary coil and the secondary coil included in each of the plurality of phase shifters are provided inside the base;
   the primary coil and the secondary coil included in each of the plurality of phase shifters each include a plurality of loop-shaped conductive patterns defining a coil of a plurality of turns over a plurality of layers of the base;
   the primary coil and the secondary coil included in each of the plurality of phase shifters each include a winding axis extending in a lamination direction in which the plurality of layers are laminated;
   the plurality of phase shifters include a first phase shifter and a second phase shifter that are adjacent to each other;
   the first phase shifter and the second phase shifter include coupling portions that overlap when viewed in plan in the lamination direction and are coupled at a polarity to reduce or prevent unwanted coupling between the first phase shifter and the second phase shifter; and
   the coupling portions are part of the plurality of loop-shaped conductive patterns and are included in only a portion of at least one of the primary and secondary coils of the first and second phase shifters.

2. A multiplexer/demultiplexer comprising:
   a common port;
   a plurality of individual ports;
   the phase shifter module as according to claim 1;
   a circuit substrate on which the phase shifter module is mounted; and
   a plurality of SAW filters mounted on the circuit substrate; wherein
   the plurality of SAW filters each include a first terminal and a second terminal;
   in each of the plurality of SAW filters, the first terminal is connected to a corresponding one of the plurality of individual terminals, and the second terminal is connected to a corresponding one of the plurality of individual terminals;
   the common terminal is the common port; and
   the plurality of individual terminals are the plurality of individual ports.

3. The multiplexer/demultiplexer according to claim 2, wherein, in each of the plurality of phase shifters:
   a connection portion of a second end of the primary coil and a first end of the secondary coil is connected to a reference potential terminal;
   a first end of the primary coil is connected to the common terminal;
   a second end of the secondary coil is connected to a corresponding one of the plurality of individual terminals; and
   a loop-shaped conductive pattern that is in a vicinity of the second end of the primary coil among the plurality of loop-shaped conductive patterns of the primary coil and a loop-shaped conductive pattern that is in a vicinity of the first end of the secondary coil among the plurality of loop-shaped conductive patterns of the secondary coil are closer to each other than other loop-shaped conductors included in the primary coil and the secondary coil.

4. The multiplexer/demultiplexer according to claim 3, wherein winding axes of the plurality of loop-shaped conductive patterns of the primary coil and the secondary coil of each of the plurality of phase shifters are at different positions.

5. The multiplexer/demultiplexer according to claim 2, wherein a number of the plurality of phase shifters is three.

6. The multiplexer/demultiplexer according to claim 2, wherein a number of the plurality of turns is less than three.

7. The multiplexer/demultiplexer according to claim 2, wherein each of the plurality of phase shifters has a transformer structure.

8. A communication apparatus comprising:
a power supply circuit;
an antenna; and
the multiplexer/demultiplexer according to claim 2.

9. A multiplexer/demultiplexer comprising:
a common port;
a plurality of individual ports;
the phase shifter module according to claim 1; and
a plurality of SAW filters mounted on the phase shifter module; wherein
the plurality of SAW filters each include a first terminal and a second terminal;
the common terminal and the plurality of individual terminals are mounted on a first surface of the base of the phase shifter module;
the plurality of individual terminals and a plurality of SAW filter second connection terminals are provided on a second surface, which is a surface opposite to the first surface of the base;
the base of the phase shifter module includes a line that connects one of the plurality of SAW filter second connection terminals to one of the plurality of individual terminals;
in each of the plurality of SAW filters, the first terminal is connected to a corresponding one of the plurality of individual terminals, and the second terminal is connected to a corresponding one of the plurality of SAW filter second connection terminals;
the common terminal is the common port; and
the plurality of individual terminals are the plurality of individual ports.

10. The multiplexer/demultiplexer according to claim 9, wherein, in each of the plurality of phase shifters:
a connection portion of a second end of the primary coil and a first end of the secondary coil is connected to a reference potential terminal;
a first end of the primary coil is connected to the common terminal;
a second end of the secondary coil is connected to a corresponding one of the plurality of individual terminals; and
a loop-shaped conductive pattern that is in a vicinity of the second end of the primary coil among the plurality of loop-shaped conductive patterns of the primary coil and a loop-shaped conductive pattern that is in a vicinity of the first end of the secondary coil among the plurality of loop-shaped conductive patterns of the secondary coil are closer to each other than other loop-shaped conductors included in the primary coil and the secondary coil.

11. The multiplexer/demultiplexer according to claim 10, wherein winding axes of the plurality of loop-shaped conductive patterns of the primary coil and the secondary coil of each of the plurality of phase shifters are at different positions.

12. The multiplexer/demultiplexer according to claim 9, wherein a number of the plurality of phase shifters is three.

13. The multiplexer/demultiplexer according to claim 9, wherein a number of the plurality of turns is less than three.

14. The multiplexer/demultiplexer according to claim 9, wherein each of the plurality of phase shifters has a transformer structure.

15. A communication apparatus comprising:
a power supply circuit;
an antenna; and
the multiplexer/demultiplexer according to claim 9.

16. The phase shifter module according to claim 1, wherein, in each of the plurality of phase shifters:
a connection portion of a second end of the primary coil and a first end of the secondary coil is connected to a reference potential terminal;
a first end of the primary coil is connected to the common terminal;
a second end of the secondary coil is connected to a corresponding one of the plurality of individual terminals; and
a loop-shaped conductive pattern that is in a vicinity of the second end of the primary coil among the plurality of loop-shaped conductive patterns of the primary coil and a loop-shaped conductive pattern that is in a vicinity of the first end of the secondary coil among the plurality of loop-shaped conductive patterns of the secondary coil are closer to each other than other loop-shaped conductors included in the primary coil and the secondary coil.

17. The phase shifter module according to claim 16, wherein winding axes of the plurality of loop-shaped conductive patterns of the primary coil and the secondary coil of each of the plurality of phase shifters are at different positions.

18. The phase shifter module according to claim 1, wherein a number of the plurality of phase shifters is three.

19. The phase shifter module according to claim 1, wherein a number of the plurality of turns is less than three.

20. The phase shifter module according to claim 1, wherein each of the plurality of phase shifters has a transformer structure.

* * * * *